(12) United States Patent
Price et al.

(10) Patent No.: US 10,050,635 B2
(45) Date of Patent: Aug. 14, 2018

(54) AMPLIFIER CALIBRATION

(71) Applicant: QUALCOMM Incorporated, San Diego, CA (US)

(72) Inventors: Burt Price, Apex, NC (US); Ajay Janardanan, Raleigh, NC (US); Yeshwant Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/273,498

(22) Filed: Sep. 22, 2016

(65) Prior Publication Data

US 2017/0338830 A1 Nov. 23, 2017

Related U.S. Application Data

(60) Provisional application No. 62/340,443, filed on May 23, 2016.

(51) Int. Cl.
*H03M 1/06* (2006.01)
*H03M 1/10* (2006.01)
*H03F 3/45* (2006.01)

(52) U.S. Cl.
CPC ...... *H03M 1/0617* (2013.01); *H03F 3/45977* (2013.01); *H03M 1/1009* (2013.01); *H03F 2200/375* (2013.01); *H03F 2203/45044* (2013.01); *H03F 2203/45048* (2013.01)

(58) Field of Classification Search
CPC .. H03F 3/45596; H03F 3/456; H03F 3/45605; H03F 3/45744–3/45753
USPC ...................................................... 341/118
See application file for complete search history.

(56) References Cited

U.S. PATENT DOCUMENTS

| | | | | |
|---|---|---|---|---|
| 6,081,214 A | * | 6/2000 | Morisson | H03F 3/45479 341/118 |
| 6,225,848 B1 | * | 5/2001 | Tilley | H03F 1/304 327/307 |
| 6,556,154 B1 | * | 4/2003 | Gorecki | H03H 11/04 341/118 |
| 6,611,794 B1 | | 8/2003 | Fleming-Dahl | |
| 6,985,098 B2 | * | 1/2006 | Lee | H03F 1/304 341/118 |
| 7,023,266 B2 | * | 4/2006 | Chung | H03F 3/45775 330/260 |

(Continued)

FOREIGN PATENT DOCUMENTS

EP 2221974 A2 * 8/2010 ......... H03F 3/45753
WO 2004073163 A1 8/2004

OTHER PUBLICATIONS

G. Nagy et al., Digital Methods of Offset Compensation in 90nm CMOS Operational Amplifiers, 2013 IEEE 16th International Symposium on Design and Diagnostics of Electronic Circuits & Systems (DDECS), 2013, pp. 124-127.*

(Continued)

*Primary Examiner* — Howard Williams
(74) *Attorney, Agent, or Firm* — Qualcomm Incorporated-Toler

(57) ABSTRACT

A device includes an amplifier and calibration circuitry coupled to the amplifier. The calibration circuitry is configured to receive calibration values. The calibration circuitry is also configured to generate an output value in response to receiving a timing input.

30 Claims, 4 Drawing Sheets

(56) References Cited

U.S. PATENT DOCUMENTS

| | | | |
|---|---|---|---|
| 7,132,882 B2* | 11/2006 | Chen | H03F 3/45085 |
| | | | 330/259 |
| 7,889,251 B1 | 2/2011 | Ng et al. | |
| 8,380,149 B2 | 2/2013 | Nonin | |
| 8,576,001 B2* | 11/2013 | Pyo | G01R 33/0029 |
| | | | 330/6 |
| 8,618,839 B2* | 12/2013 | Chi | H03F 3/45183 |
| | | | 327/51 |
| 9,077,371 B2 | 7/2015 | Price et al. | |
| 2003/0117205 A1* | 6/2003 | Cahalane | H03F 3/45973 |
| | | | 327/307 |
| 2005/0052296 A1* | 3/2005 | Manlove | H03F 3/45973 |
| | | | 341/110 |
| 2009/0135970 A1 | 5/2009 | Miyagi et al. | |
| 2009/0224952 A1 | 9/2009 | Funabashi | |

OTHER PUBLICATIONS

International Search Report and Written Opinion—PCT/US2017/027571—ISA/EPO—dated Dec. 1, 2017, 15 pages.
Partial International Search Report—PCT/US2017/027571—ISA/EPO—dated Aug. 24, 2017, 11 pages.

* cited by examiner

AMPLIFIER CALIBRATION

I. CROSS REFERENCE TO RELATED APPLICATIONS

The present application claims the benefit of U.S. Provisional Patent Application No. 62/340,443, entitled "AMPLIFIER CALIBRATION," filed May 23, 2016, which is expressly incorporated by reference herein in its entirety.

II. FIELD

The present disclosure is generally related to amplifier calibration.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

A device may include one or more amplifiers. The device may employ auto-calibration to improve performance. For example, performance of an amplifier may differ from performance of an ideal amplifier due to errors caused by process variations, thermal variations, 1/f noise, flicker noise, or a combination thereof 1/f noise may refer to a signal with a frequency spectrum such that a power spectral density is inversely proportional to a frequency of the signal. Dynamic changes during operation of the amplifier can cause auto-calibration error. For example, differences in noise present from one calibration cycle to the next may result in different calibration values for the two calibration cycles. Inaccurate calibration values may adversely impact performance of the amplifier.

IV. SUMMARY

In a particular aspect, a device includes an amplifier and calibration circuitry coupled to the amplifier. The calibration circuitry is configured to receive calibration values and to generate an output value in response to receiving a timing input. For example, the output value may correspond to an average of multiple calibration values that are determined for offset voltage cancellation of the amplifier. Averaging the calibration values may at least partially cancel the effects of noise (e.g., 1/f noise) on the variation of the generated calibration values.

In another particular aspect, a method includes accumulating a sum of calibration values at calibration circuitry coupled to an amplifier. The method also includes generating, at the calibration circuitry, an output value in response to receiving a timing input, the output value corresponding to the sum of the calibration values divided by a particular value.

In another aspect, a computer-readable storage device stores instructions that, when executed by a processor, cause the processor to perform operations including accumulating a sum of calibration values corresponding to an amplifier. The operations also include generating an output value in response to determining that a count of the calibration values satisfies a threshold. The output value is generated by dividing the sum of the calibration values by a particular value.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Systems and methods of amplifier calibration are disclosed. A device may include calibration circuitry (e.g., in an auto-calibration circuit) coupled to an amplifier. The calibration circuitry may be configured to store a sum of calibration values. The device may also include timing logic. The timing logic may be configured to output a timing input to the calibration circuitry in response to determining that a particular number of calibration cycles have elapsed. The calibration circuitry may be configured to output an average calibration value in response to receiving the timing input. For example, the calibration circuitry may generate the average calibration value by dividing the sum of the calibration values by the particular number of calibration cycles. The calibration circuitry may reduce calibration errors by averaging calibration values over several calibration cycles to account for cycle-to-cycle variations (e.g., due to noise).

Figure 1:
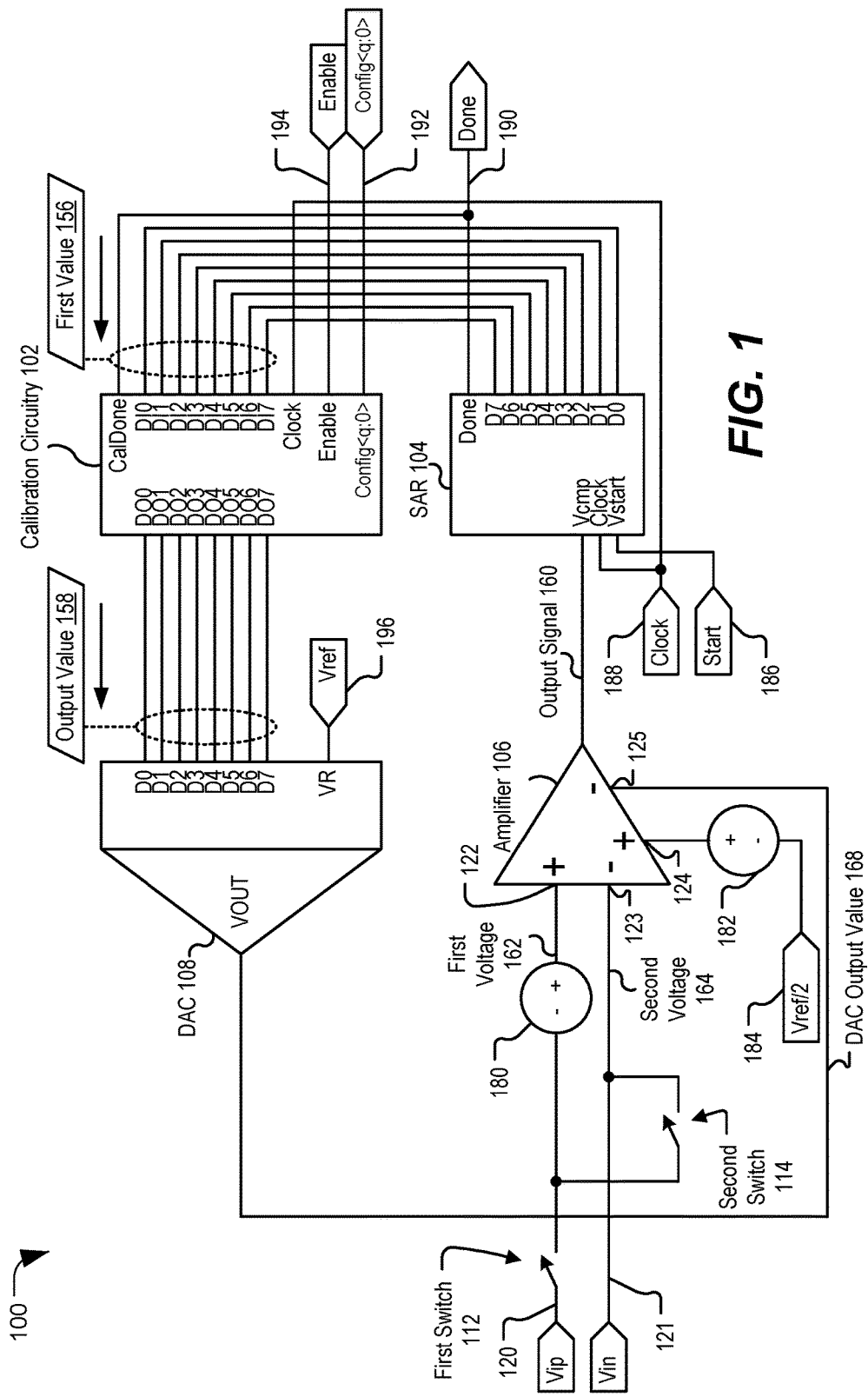
FIG. 1 is a block diagram of a particular illustrative aspect of a device operable to perform amplifier calibration.

Referring to FIG. 1, a particular illustrative aspect of a device is disclosed and generally designated 100. The device 100 includes an amplifier 106 that is coupled, via a successive approximation register (SAR) 104 and calibration circuitry 102, to a digital-to-analog converter (DAC) 108. The SAR 104, the calibration circuitry 102, and the DAC 108 may correspond to an automatic offset voltage compensation circuit. The amplifier 106 may be coupled to one or more other components or circuits (not shown). In FIG. 1, offset voltage cancelling circuitry (e.g., the SAR 104, the calibration circuitry 102, the amplifier 106, and the DAC 108) including the amplifier 106 is illustrated. The amplifier 106 may be coupled to one or more application circuits (not shown). The amplifier 106 may receive an input from an application circuit, provide an output to the application circuit, or both, between calibration cycles.

The calibration circuitry 102 may be configured to receive calibration values from the SAR 104 (e.g., an automatic offset voltage compensation circuit) and to generate an output value based on a timing input. The calibration circuitry 102 may be configured to average calibration values generated by the other circuitry (e.g., the SAR 104) to reduce (e.g., minimize) the effects of noise on the generated calibration values, as described herein. The device 100, including the calibration circuitry 102, may perform similarly in the presence of the effects of noise on the generated calibration values as without the calibration circuitry 102 in the absence of the effects of noise. Without the calibration circuitry 102, the outputs of the SAR 104 may be coupled to the inputs of the DAC 108 (as compared to the inputs of the calibration circuitry 102). The calibration circuitry 102 may thus enable the device 100 to operate as though there are reduced or no effects of noise on the generated calibration values.

The amplifier 106 includes a differential amplifier having primary differential inputs 122, 123 coupled to receive a differential signal via a first terminal (Vip) 120 and a second terminal (Vin) 121, respectively. The amplifier 106 also includes auxiliary differential inputs 124, 125. The amplifier 106 is configured to generate an amplifier output signal 160 based on a first difference between signals received at the primary differential inputs 122, 123 and further based on a second difference between signals received at the auxiliary differential inputs 124, 125.

The amplifier 106 may deviate from ideal amplifier operation due to one or more factors, such as thermal effects, process variations that result in mismatched components in the amplifier 106, one or more other factors, or any combination thereof. Although such variations may occur at one or more components internal to the amplifier 106, deviations from ideal operation resulting from such variations may be modeled as resulting from a first offset voltage 180 applied at the primary differential input 122 and a second offset voltage 182 applied at the auxiliary differential input 124 of an ideal amplifier. The second offset voltage 182 may function as an offset to a reference voltage Vref/2 184. Variations from ideal amplifier operation (e.g., effects of the offset voltages 180, 182) may be at least partially compensated by adjusting a voltage at the auxiliary differential input 125 during a calibration operation.

The SAR 104, the calibration circuitry 102, and the DAC 108 may be configured to perform a calibration operation that generates a voltage that is provided to the auxiliary differential input 125 to reduce or eliminate effects of the offset voltages 180, 182. For example, the SAR 104 may be responsive to a start signal 186, a clock signal 188, and the amplifier output signal 160. The SAR 104 is configured to generate a SAR output (e.g., an 8-bit digital word) that causes, via feedback through the calibration circuitry 102 and the DAC 108, the amplifier output signal 160 to have a voltage that is most similar to a reference voltage (e.g., 0 volts). For example, in response to the start signal 186 indicating the start of a calibration operation, the SAR 104 may perform a binary search of output values by generating, during a first cycle of the clock signal 188, a first SAR output of bits <d7 d6 d5 d4 d3 d2 d1 d0>=10000000, where d7 is the most significant bit (MSB) and d0 is the least significant bit (LSB) of the first SAR output. A value of the amplifier output signal 160 that results from feedback of the first SAR output may be compared to the reference voltage and a second SAR output of either 1100000 or 0100000 may be selected. An updated SAR output may be generated during each successive clock cycle of the calibration operation until the binary search is complete and the SAR output represents the SAR output value that results in the closest match between the voltage at the auxiliary differential input 124 and the voltage at the auxiliary differential input 125.

Upon completion of the binary search, the SAR 104 may assert an output signal "Done" 190, such as by transitioning a voltage of the Done signal 190 from a logical low voltage to a logical high voltage. Although, for clarity of explanation, "assert" is used herein to indicate a transition of a signal from a logical low value (e.g., 0) to a logical high value (e.g., 1), and "de-assert" is used to indicate a transition from the logical high value (e.g., 1) to the logical low value (e.g., 0), in other implementations an "assert" condition, a "de-assert" condition, or both, may vary for one or more signals of the present disclosure. For example, an "assert" condition of a signal may indicate a logical low value (e.g., 0) and a "de-assert" condition of the signal may indicate a logical high value (e.g., 1). The SAR 104 may continue to assert the Done signal (e.g., hold the Done signal at the logical high voltage) during non-calibration operation of the amplifier 106. The SAR 104 may de-assert the Done signal 190 (e.g., transition the Done signal 190 to the low logical level) when a next calibration operation begins.

The calibration circuitry 102 may be configured to receive the Done signal 190, the SAR output of the SAR 104, the clock signal 188, a configuration signal "config<q:0>" 192, and an enable signal 194. The calibration circuitry 102 may be configured, while the Done signal 190 is not asserted (e.g., during a calibration operation) and while the calibration circuitry 102 is enabled via the enable signal 194, to operate in a pass-through mode. In the pass-through mode, SAR output values received at the calibration circuit 102 may be provided as output values to the DAC 108. For example, a first value 156 received from the SAR 104 may be provided as an output value 158 at the output of the calibration circuitry 102.

The calibration circuitry 102 may be responsive to assertion of the Done signal 190 (e.g., a rising edge transition of the Done signal 190) to sample and hold the SAR output value, add the SAR output value to an accumulated sum of SAR output values, and update a count of SAR output values that have been accumulated. The calibration circuitry 102 may also, in response to assertion of the Done signal 190, either output the SAR output value (e.g., the first value 156) as the output value 158 or output an average of accumulated SAR output values as the output value 158. For example, the calibration circuitry 102 may output the last received SAR output value each time the Done signal 190 is asserted, until the count of SAR output values reaches a threshold (e.g., a threshold value indicated by the configuration signal 192). Upon reaching the threshold, the calibration circuitry 102 may respond to a timing signal by dividing the accumulated SAR output values by the count of SAR output values to generate an average SAR output value and outputting the result as the output value 158. An example implementation of the calibration circuitry 102 is described in further detail with reference to FIG. 2.

The DAC 108 is configured to receive the output of the calibration circuitry 102, such as the output value 158, as a digital input signal and to receive a reference voltage Vref 196. The DAC 108 is configured to generate an analog voltage based on the digital input signal and the Vref 196. An output of the DAC 108 is coupled to the auxiliary differential input 125 of the amplifier 106 to provide the analog voltage as a DAC output value 168. The auxiliary differential input 125 may correspond to a calibration input of the amplifier 106 that is configured to receive an offset cancellation signal (e.g., the DAC output value 168) that is based on the output value 158. The Vref/2 184 may correspond to a portion (e.g., ½) of the Vref 196.

The device 100 may also include switching circuitry configured to selectively couple or decouple the primary differential inputs 122, 123 of the amplifier 106 to one or both of the terminals 120, 121. For example, a first switch 112 may selectively couple the primary differential input 122 to the first terminal 120. A second switch 114 may selectively connect together or "short" the primary differential inputs 122, 123. The switching circuitry (e.g., the switches 112, 114) may be controlled by control circuitry of the device 100 based on an operating mode, as described below.

During operation, the device 100 may alternate between operating in a calibration mode and a "normal" (e.g., non-calibration) mode. In the normal mode, the first switch 112 may be closed and the second switch 114 may be opened. The amplifier 106 may generate the amplifier output signal 160 based on a difference between the differential signals at the terminals 120, 121. The amplifier output signal 160 may be routed to other circuitry of the device 100 (not shown). The offset voltages 180 and 182 may be at least partially compensated by the DAC output value 168 that is held at the output of the DAC 108 and received at the auxiliary differential input 125.

The device 100 may switch from the normal mode to the calibration mode periodically or in response to one or more conditions. In the calibration mode, the first switch 112 may be opened and the second switch 114 may be closed to short the primary differential inputs 122, 123 causing the amplifier 106 to generate an output corresponding to first voltage 162 at the primary differential input 122 and a second voltage 164 at the primary differential input 123. During the calibration mode, the amplifier 106 may be connected to the calibration circuitry 102, the SAR 104, and the DAC 108 and may be disconnected from other circuitry of the device 100 (not shown).

The start signal 186 may be asserted, and the SAR 104 may initiate a binary search as described above, by adjusting output values based on changes detected in the amplifier output signal 160. When the search has completed, the SAR 104 may assert the Done signal 190.

In response to assertion of the Done signal 190, the calibration circuitry 102 may add the SAR output value to the accumulated SAR output values and update a count of the accumulated SAR output values. The calibration circuitry 102 may compare the count of the accumulated SAR output values to the threshold and may generate a timing input in response to the count equaling the threshold, such as described in further detail with reference to FIG. 2. In response to the timing input, the calibration circuitry 102 may generate an output value corresponding to an average SAR output value. Otherwise, when the count of the accumulated SAR output values is less than the threshold, the calibration circuitry 102 may generate an output value that matches the SAR output value received at the calibration circuitry 102 (e.g., in the pass-through mode). The DAC 108 may receive the output value from the calibration circuitry 102 and generate an updated version of the DAC output value 168. The device 100 may then switch to the normal mode using the updated version of the DAC output value 168.

By generating the DAC output value 168 based on the SAR output values before the count of SAR output values equals the threshold, calibration of the amplifier 106 may correspond to a most recently determined calibration value. Generating the DAC output value 168 based on an average SAR output value in response to the count equaling the threshold enables reduction or cancellation of the effects of noise on the individual calibration values. The calibration circuitry 102 may therefore reduce calibration errors by averaging calibration values over several calibration cycles to account for cycle-to-cycle variations (e.g., due to noise).

Although FIG. 1 depicts that the SAR 104 provides an 8-bit value (e.g., the first value 156) to the calibration circuitry 102, and that the calibration circuitry 102 provides an 8-bit value (e.g., the output value 158) to the DAC 108, it should be understood that the SAR 104 may provide an m-bit value to the calibration circuitry 102 and the calibration circuitry 102 may provide an n-bit value to the DAC 108, where m and n are positive integer values and m may be the same as or distinct from n. Although FIG. 1 depicts that the device 100 includes the amplifier 106 having primary and secondary pairs of differential inputs, in other implementations the device 100 may include one or more other types of amplifiers that are responsive to a calibration signal (e.g., the DAC output value 168).

Figure 2:
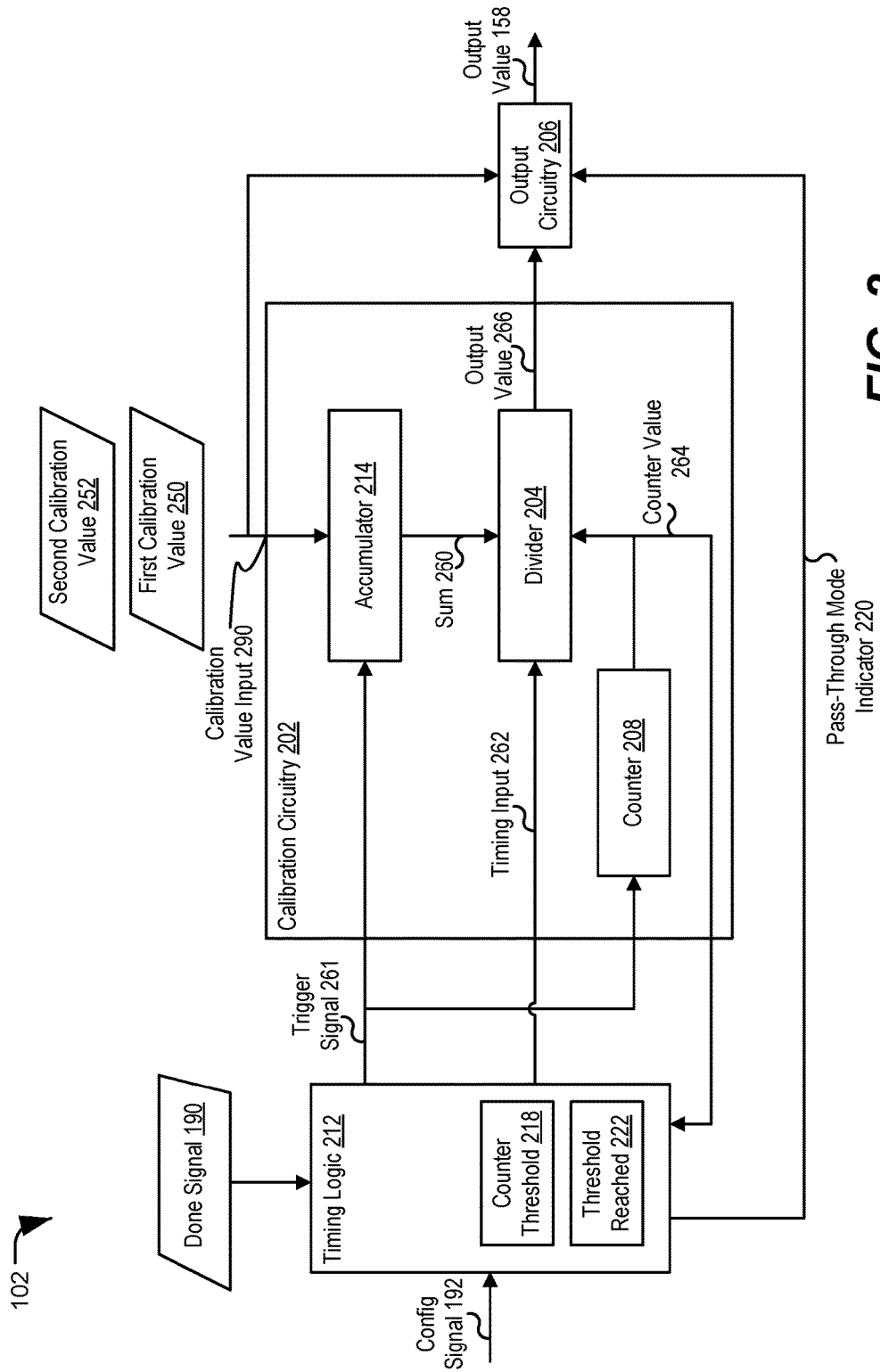
FIG. 2 is a diagram of a particular illustrative aspect of the device of FIG. 1.

Referring to FIG. 2, an illustrative example of the calibration circuitry 102 is shown. The calibration circuitry 102 includes calibration circuitry 202 coupled to timing logic 212 and to output circuitry 206.

The timing logic 212 may be coupled to the SAR 104 of FIG. 1. The timing logic 212 may be configured to receive the Done signal 190 from the SAR 104 and to receive the configuration signal 192. The timing logic 212 may be configured to store a counter threshold 218. For example, the timing logic 212 may be configured to store the counter threshold 218 in a register as the "config<q:0>" value received via the configuration signal 192. The timing logic 212 may be configured to store a threshold reached indicator 222. For example, the timing logic 212 may be configured to store the threshold reached indicator 222 in a register to indicate whether a count of accumulated SAR values has reached the counter threshold 218.

The timing logic 212 is configured to generate a trigger signal 261 and a timing input 262. For example, the trigger signal 261 may indicate a first logical value (e.g., 0) when a received SAR value is not to be added to the accumulated SAR values and may indicate a second logical value (e.g., 1) when a received SAR value is to be added to the accumulated SAR values. To illustrate, a last SAR value received during a calibration cycle of the device 100 of FIG. 1 may be added to the accumulated SAR values. SAR values received prior to the last SAR value during the calibration cycle may be passed through the output circuitry 206 as the output value 158 without being added to the accumulated SAR values. The timing input 262 may indicate a first logical value (e.g., 0) when a count of accumulated SAR values is less than the counter threshold 218 and may indicate a second logical value (e.g., 1) when the count of accumulated SAR values is equal to or greater than the counter threshold 218.

The calibration circuitry 202 includes a divider 204 coupled to an accumulator 214 and to a counter 208. The accumulator 214 may be coupled to the SAR 104 of FIG. 1. For example, an output of the SAR 104 may be coupled to a calibration value input 290 that is coupled to an input of the accumulator 214 and that is also coupled to the output circuitry 206. The accumulator 214 may be configured to receive the first value 156 from the SAR 104. The accumulator 214 may be configured to store a sum 260 of calibration values. The accumulator 214 may be responsive to the trigger signal 261 to add a value at the calibration value input 290 to the sum 260. The counter 208 may be configured to store a counter value 264 and may be responsive to the trigger signal 261 to increment the counter value 264. The divider 204 may be configured to generate an output value 266 in response to receiving the timing input 262 from the timing logic 212. The output value 266 may correspond to a ratio of the sum 260 and the counter value 264. The calibration circuitry 102 may be configured to generate the output value 158, as described herein.

During an initialization phase, the calibration circuitry 102 may initialize the timing logic 212, the calibration circuitry 202, or both, as described herein. The calibration circuitry 202 may set a first sum value (e.g., the sum 260) of the accumulator 214 to a default accumulator value (e.g., 0), a first counter value 264 of the counter 208 to a default counter value (e.g., 0), or both. The trigger signal 261 may have the first logical value (e.g., 0) and the timing input 262 may have the first logical value (e.g., 0). The timing logic 212 may assert a pass-through mode indicator 220. The timing logic 212 may set the threshold reached indicator 222 to have a first logical value (e.g., 0) indicating that the counter threshold 218 has not been reached. The timing logic 212 may set the counter threshold 218 to a default value (e.g., 16). In a particular aspect, the timing logic 212 may receive the configuration signal 192 and may set the counter threshold 218 based on the configuration signal 192.

A calibration cycle may correspond to a time interval during which the device 100 of FIG. 1 is in a calibration mode. A SAR iteration may correspond to a cycle of the clock signal 188 of FIG. 1 during a calibration mode of the device 100.

During each SAR iteration of a first calibration cycle, the calibration circuitry 102 may operate in a pass-through mode, as described herein. The accumulator 214 may receive a calibration value (e.g., the first value 156) via the calibration value input 290 from the SAR 104. The timing logic 212 may receive the Done signal 190 having a first logical value (e.g., 0) from the SAR 104. The timing logic 212 may, in response to determining that the Done signal 190 is not asserted, de-assert the trigger signal 261, de-assert the timing input 262, assert the pass-through mode indicator 220, or a combination thereof. The de-asserted trigger signal 261 may indicate that the sum 260 of the accumulator 214, the counter value 264 of the counter 208, or both, are not to be updated. The de-asserted timing input 262 may indicate that the output value 266 is not to be updated. The asserted pass-through mode indicator 220 may indicate that the calibration circuitry 102 is to operate in the pass-through mode.

The accumulator 214 may, in response to determining that the trigger signal 261 is de-asserted, disregard the calibration value at the calibration value input 290. For example, the accumulator 214 may refrain from updating the sum 260 in response to determining that the trigger signal 261 is de-asserted. The output circuitry 206 may receive the calibration value (e.g., the first value 156) via the calibration value input 290. The output circuitry 206 may, in response to determining that the pass-through mode indicator 220 is asserted, output the calibration value (e.g., the first value 156) as the output value 158.

During a particular (e.g., last) SAR iteration of the first calibration cycle, the calibration circuitry 102 may update the sum 260 stored at the accumulator 214 and the counter value 264 stored at the counter 208, as described herein. The accumulator 214 may receive a first calibration value 250 (e.g., the first value 156) from the SAR 104 of FIG. 1. The Done signal 190 may be asserted during the particular (e.g., last) SAR iteration. For example, the Done signal 190 may transition from a first logical value (e.g., 0) to a second logical value (e.g., 1) during the particular (e.g., last) SAR iteration of the first calibration cycle. The timing logic 212 may assert the trigger signal 261 in response to detecting the transition of the Done signal 190 from the first logical value (e.g., 0) to the second logical value (e.g., 1). The accumulator 214 may, responsive to the assertion of the trigger signal 261, provide a second sum value (e.g., the sum 260) to the divider 204. The second sum value (e.g., the sum 260) may represent a sum of the first calibration value 250 and a first sum value previously stored at the accumulator 214. The accumulator 214 may store the second sum value (e.g., the sum 260). Also responsive to the assertion of the trigger signal 261, the counter 208 may increment (e.g., by 1) the counter value 264.

The timing logic 212 may, in response to determining that the incremented counter value 264 fails to satisfy (e.g., is less than) the counter threshold 218, refrain from updating the threshold reached indicator 222 and may continue to assert the pass-through mode indicator 220. The output circuitry 206 may, in response to determining that the pass-through mode indicator 220 is asserted, output the first calibration value 250 as the output value 158.

Between calibration cycles, the calibration circuitry 102 may output a last received SAR calibration value in response to determining that the threshold reached indicator 222 has a first logical value (e.g., 0), as described herein. The Done signal 190 may remain asserted between calibration cycles.

During each SAR iteration of a second calibration cycle, the calibration circuitry 102 may operate in a pass-through mode, as described herein. The accumulator 214 may receive a calibration value (e.g., the first value 156) via the calibration value input 290 from the SAR 104. The Done signal 190 may be de-asserted. The timing logic 212 may, in response to determining that the Done signal 190 is de-asserted, de-assert the trigger signal 261 to prevent operation of the accumulator 214 and the counter 208, de-assert the timing input 262 to prevent operation of the divider 204, and assert the pass-through mode indicator 220.

During a final SAR iteration of the second calibration cycle, the calibration circuitry 102 may update the sum 260 stored at the accumulator 214, the counter value 264 stored at the counter 208, and the threshold reached indicator 222 to a second logical value (e.g., 1). For example, the accumulator 214 may receive a second calibration value 252 from the SAR 104 of FIG. 1 when the Done signal 190 is asserted during the final SAR iteration of the second calibration cycle. For example, the Done signal 190 may transition from a first logical value (e.g., 0) to a second logical value (e.g., 1) during the final SAR iteration. The timing logic 212 may assert the trigger signal 261 in response to detecting the transition of the Done signal 190 from the first logical value (e.g., 0) to the second logical value (e.g., 1).

The accumulator 214 may, responsive to the assertion of the trigger signal 261, add the second calibration value 252 to the accumulated sum 260 to generate a new accumulated sum 260. Additionally, in response to the assertion of the trigger signal 261, the counter 208 may increment (e.g., increase by 1) the counter value 264.

The timing logic 212 may, in response to detecting that the counter value 264 satisfies (e.g., is greater than or equal to) the counter threshold 218, update the threshold reached indicator 222 to have a second logical value (e.g., 1) and may assert the timing input 262. In a particular aspect, the timing logic 212 may determine a count of calibration cycles based on the counter value 264. The timing logic 212 may assert the timing input 262 in response to determining that the count of calibration cycles satisfies (e.g., is greater than or equal to) the counter threshold 218. Receipt of the timing input 262 may indicate that the sum 260 is based on calibration values received during a number (e.g., 16) of calibration cycles that correspond to the counter threshold 218.

The divider 204 may, responsive to the asserted timing input 262, generate an output value 266 by dividing the sum 260 by the counter value 264 and may latch the output value 266 at an output of the divider 204. For example, the divider 204 may continue to output the output value 266 while the timing input 262 is de-asserted subsequent to the second calibration cycle. Even though the sum 260 and the counter value 264 may subsequently change, the divider 204 may continue to output the output value 266 until detecting that the timing input 262 is re-asserted in a later calibration cycle. The output value 266 may represent an average calibration value corresponding to a number (e.g., 16) of calibration values. In some implementations, the divider 204 performs floating point division based on the counter threshold 218.

During the final SAR iteration of the second calibration cycle, during the final SAR iterations of subsequent calibration cycles, and between subsequent calibration cycles, the calibration circuitry 102 may provide an average calibration value as the output value 158 to the DAC 108 in response to determining that the threshold reached indicator 222 indicates that the counter threshold 218 has been reached. The timing logic 212 may de-assert the pass-through mode indicator 220 in response to determining that the Done signal 190 is asserted, that the threshold reached 222 has a second logical value (e.g., 1), or both. The output circuitry 206 may, in response to determining that the pass-through mode indicator 220 is de-asserted, provide the output value 266 as the output value 158 to the DAC 108.

When enough calibration values have been received to generate the average calibration value (e.g., when the counter value 264 is equal to the counter threshold 218), the output value 158 may be equal to the output value 266 between calibration cycles. However, until enough calibration cycles have been performed to generate the output value 266, the output value 158 may equal the most recently received value at the calibration value input 290.

After the threshold reached indicator 222 is set to a value (e.g., 1) to indicate that the counter threshold 218 has been reached, the timing logic 212 may update (e.g., increase) the counter threshold 218. The output circuitry 206 may output a new output value 266 in response to determining that the counter value 264 has incremented to a value equal to the updated counter threshold 218. The accuracy of the output value 266 may improve when the output value 266 is generated based on larger values of the sum 260 and the counter value 264.

Subsequent to setting the threshold reached indicator 222 to a value (e.g., 1) to indicate that the counter threshold 218 has been reached, the calibration circuitry 102 may reset the sum 260 of the accumulator 214, the counter value 264 of the counter 208, the counter threshold 218, or a combination thereof. For example, the calibration circuitry 102 may set the sum 260 to a default value (e.g., 0), the counter value 264 to a default value (e.g., 0), or both. As another example, the calibration circuitry 102 may reset the sum 260 and the counter value 264 in response to determining that the sum 260 satisfies (e.g., is greater than or equal to) a threshold sum value (e.g., 240), that the counter value 264 satisfies (e.g., is greater than or equal to) a reset threshold, or both. The accumulator 214 may have a particular bit (e.g., 8-bit) capacity to store the sum 260. Based on the particular bit capacity, the accumulator 214 may be configured to store up to a particular value (e.g., 255) before generating an overflow. The calibration circuitry 102 may reset the sum 260 to prevent an overflow. The reset threshold may be the same as or distinct from the counter threshold 218. As an alternate to resetting the sum 260 and the counter value 264 to default values, the calibration circuitry 102 may reset the sum 260 by dividing the sum 260 by a default value (e.g., 2) and may reset the counter value 264 by dividing the counter value 264 by the default value (e.g., 2). With the sum 260 and the counter value 264 each divided by the same value (e.g., 2), additional capacity is made available in the accumulator 214 and the counter 208 without changing the value of the output value 266.

The calibration circuitry 102 may thus output an average calibration value when a particular number of calibration values are received. The average calibration value may reduce (e.g., eliminate) the effects of noise by averaging the noise over the particular number of calibration values.

Figure 3:
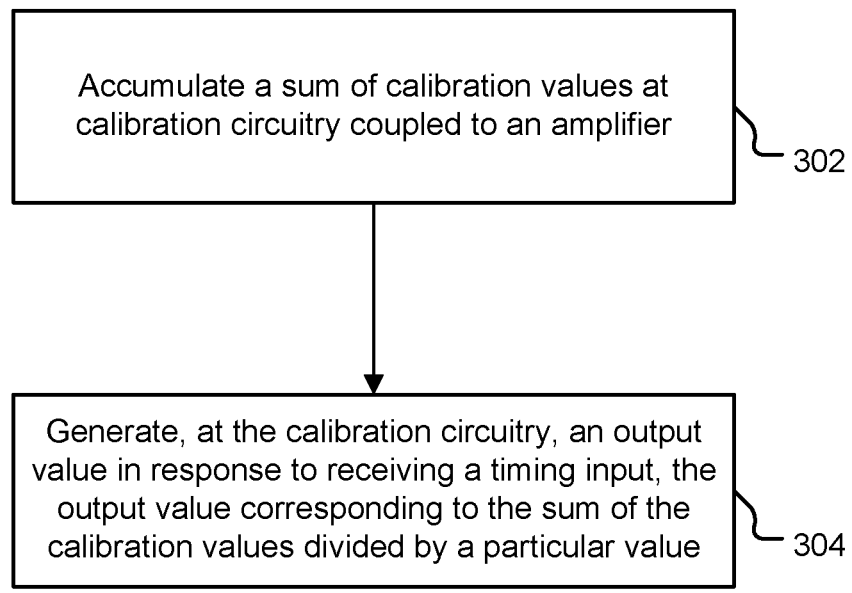
FIG. 3 is a flow chart of a particular illustrative aspect of a method of amplifier calibration.

Referring to FIG. 3, a particular example of a method of operation is shown and generally designated 300. The method 300 may be performed by the device 100 of FIG. 1, the calibration circuitry 102 of FIGS. 1-2, one or more other circuits or devices, or a combination thereof.

The method 300 includes accumulating a sum of calibration values at calibration circuitry coupled to an amplifier, at 302. For example, the accumulator 214 of FIG. 2 may accumulate the sum 260 of calibration values. The calibration values may include the first value 156 of FIG. 1, the first calibration value 250 of FIG. 2, the second calibration value 252 of FIG. 2, or a combination thereof. The accumulator 214 may be included in the calibration circuitry 202 that is coupled to the amplifier 106.

The method 300 also includes generating, at the calibration circuitry, an output value in response to receiving a timing input, at 304. For example, the calibration circuitry 202 may generate the output value 266 as the output value 158 in response to receiving the timing input 262. The output value 266 may correspond to the sum 260 divided by a particular value, such as the counter value 264.

A count of the calibration values used to generate the sum 260 may correspond to a particular number of calibration cycles. The output value 266 may indicate an average of the calibration values. The calibration values may include the first value 156 of FIG. 1, the first calibration value 250 of FIG. 2, the second calibration value 252 of FIG. 2, or a combination thereof. The method 300 may include receiving, at the calibration circuitry 102 of FIG. 1, the calibration values from the SAR 104. In a particular aspect, the method 300 may include receiving, at the calibration circuitry 102 of FIG. 1, the calibration values from an automatic offset voltage compensation circuit.

The method 300 may include determining, at the timing logic 212 of FIG. 2, a count of calibration cycles (e.g., the counter value 264). The method 300 may include sending the timing input 262 from the timing logic 212 of FIG. 2 to the calibration circuitry 202 of FIG. 2 in response to determining that the counter value 264 satisfies the counter threshold 218. The method 300 may include receiving, at the calibration circuitry 202, the timing input 262 during a calibration mode.

The method 300 may include generating, at the DAC 108 of FIG. 1, an amplifier compensation voltage (e.g., the DAC output value 168) based on the output value 158. The method 300 may include, at the device 100, providing the amplifier compensation voltage (e.g., the DAC output value 168) from the DAC 108 to the amplifier 106. The method 300 may include performing, at the amplifier 106, offset cancellation based on the output value 158. For example, the amplifier 106 may perform offset cancellation based on the DAC output value 168.

The method 300 may thus enable generating an average calibration value in response to receiving a timing input. The average calibration value may reduce (e.g., eliminate) the effects of noise by averaging the noise over a number of calibration values.

Figure 4:
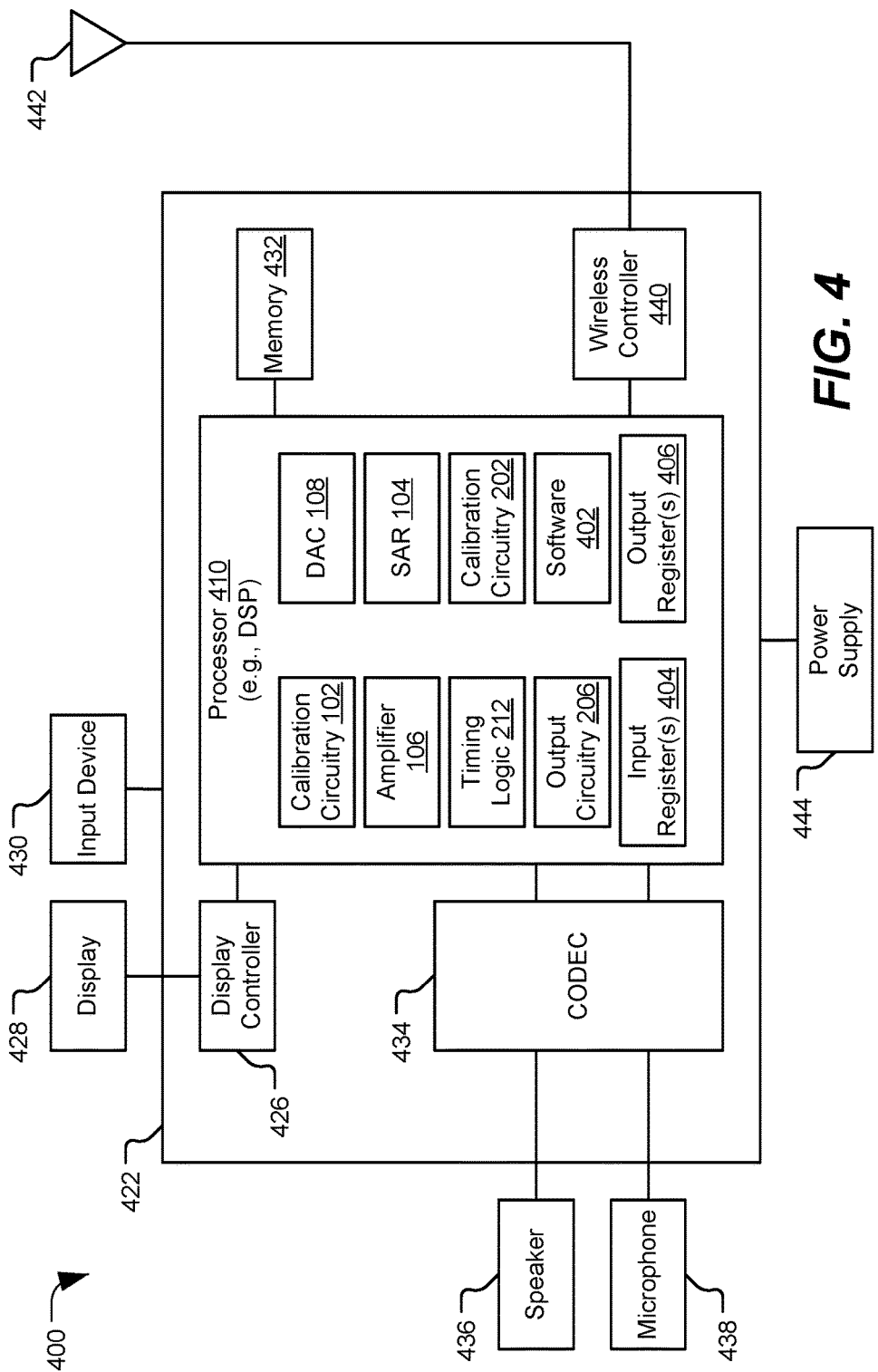
FIG. 4 is a block diagram of portable device operable to perform amplifier calibration.

Referring to FIG. 4, a block diagram of a particular illustrative aspect of an electronic device is depicted and generally designated 400. The device 400 includes a processor 410, such as a digital signal processor (DSP), coupled to a memory 432. The device 400 may include the amplifier 106, the SAR 104, the DAC 108, the calibration circuitry 102, the calibration circuitry 202, the output circuitry 206, the timing logic 212, or a combination thereof. For example, the processor 410 may include the amplifier 106, the SAR 104, the DAC 108, and the calibration circuitry 102 including, the calibration circuitry 202, the output circuitry 206, and the timing logic 212. In a particular aspect, the processor 410 may execute software 402 configured to cause the processor 410 to access one or more input registers 404, one or more output registers 406, or a combination thereof. The device 400 may perform one or more operations described with reference to the devices of FIGS. 1-2, the method of FIG. 3, or any combination thereof.

In a particular aspect, the software 402 may correspond to one or more instructions executable by the processor 410 to perform one or more operations described with reference to the devices of FIGS. 1-2, the method of FIG. 3, or any combination thereof. For example, the SAR 104 (or the software 402) may be configured to store the first value 156 of FIG. 1 (e.g., the first calibration value 250 or the second calibration value 252 of FIG. 2) in the input register(s) 404. The software 402 may be configured to maintain the sum 260, to maintain the counter value 264, and to compute the output value 266 without the processor 410 including dedicated hardware for the accumulator 214, the divider 204, the counter 208 of FIG. 2, or any combination thereof. The software 402 may be configured to determine the pass-through mode indicator 220, as described with reference to FIG. 2. The software 402 may be configured to output the first value 156 as the output value 158 to the output register(s) 406 in response to determining that the pass-through mode indicator 220 has a first logical value (e.g., 1) and to output the output value 266 of FIG. 2 as the output value 158 to the output register(s) 406 in response to determining that the pass-through mode indicator 220 has a second logical value (e.g., 0). The DAC 108 may be configured to access the output value 158 from the output register(s) 406. The DAC 108 may determine the DAC output value 168 based on the output value 158, as described with reference to FIG. 1.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434.

FIG. 4 also indicates that a wireless controller 440 can be coupled to the processor 410 and to a wireless antenna 442. In a particular aspect, the processor 410, the display controller 426, the memory 432, the CODEC 434, and the wireless controller 440 are included in a system-in-package or system-on-chip device 422. In a particular aspect, an input device 430 and a power supply 444 are coupled to the system-on-chip device 422. Moreover, in a particular aspect, as illustrated in FIG. 4, the display 428, the input device 430, the speaker 436, the microphone 438, the wireless antenna 442, and the power supply 444 are external to the system-on-chip device 422. However, each of the display 428, the input device 430, the speaker 436, the microphone 438, the wireless antenna 442, and the power supply 444 can be coupled to a component of the system-on-chip device 422, such as an interface or a controller. The device 400 may include at least one of a mobile phone, a communication device, a computer, a music player, a video player, an entertainment unit, a navigation device, a personal digital assistant (PDA), a decoder, or a set top box.

In conjunction with the described aspects, an apparatus includes means for amplifying an input signal. For example, the means for amplifying an input signal may include the amplifier 106, one or more other devices, circuits, or modules configured to amplify an input signal, or a combination thereof.

The apparatus also includes means for calibrating the means for amplifying by generating an output value in response to receiving a timing input. For example, the means for calibrating may include the calibration circuitry 102, one or more other devices, circuits, or modules configured to calibrate the amplifier 106 by generating an output value in response to receiving a timing input, or a combination thereof. The output value (e.g., the output value 158 of FIG. 1) may be based on calibration values. The calibration values may include the first value 156 of FIG. 1, the first calibration value 250, the second calibration value 252 of FIG. 2, or a combination thereof.

The foregoing disclosed devices and functionalities, e.g., as described with reference to any one or more of the FIGS. 1-4, may be designed and configured into computer files (e.g., Register Transfer Level (RTL), Graphic Data System (GDSII), GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in the devices described above.

Those of skill would further appreciate that the various illustrative logical blocks, configurations, modules, circuits, and algorithm steps described in connection with the aspects disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in a computer-readable storage device, random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A device comprising:
   an amplifier having first and second primary differential inputs, first and second auxiliary differential inputs, an output;
   conversion circuitry configured to generate calibration values based on the output of the amplifier; and
   calibration circuitry configured to output, in a first operating mode, the calibration values received from the conversion circuitry and to output, in a second operating mode, an output value based on a sum of the calibration values received during a time period divided by a number of calibration cycles.

2. The device of claim 1, wherein one of the auxiliary differential inputs of the amplifier is configured to receive a compensation signal based on the output of the calibration circuitry.

3. The device of claim 2, wherein the calibration circuitry is configured to output the output value in response to a timing input and to provide the compensation signal to the one of the auxiliary differential inputs of the amplifier.

4. The device of claim 3, wherein receipt of the timing input indicates that a count of the calibration values corresponds to the number of calibration cycles.

5. The device of claim 4, wherein, during a calibration mode, the amplifier is connected to the calibration circuitry and disconnected from other circuitry.

6. The device of claim 2, further comprising a digital-to-analog converter configured to:
   generate the compensation signal based on the output value, wherein the compensation signal comprises an amplifier compensation voltage; and
   provide the amplifier compensation voltage to the amplifier.

7. The device of claim 1, wherein the calibration circuitry comprises:
   an accumulator configured to store the sum of calibration values; and
   a divider configured to generate the output value.

8. The device of claim 1, wherein the conversion circuitry comprises a successive approximation register configured to provide the calibration values to the calibration circuitry.

9. The device of claim 1, wherein the conversion circuitry comprises an automatic offset voltage compensation circuit configured to provide the calibration values to the calibration circuitry.

10. The device of claim 1, wherein the amplifier has a calibration input that is configured to receive an offset cancellation signal that is based on the output value.

11. A method comprising:
    generating, at conversion circuitry, calibration values based on output signals of a differential amplifier;
    accumulating a sum of the calibration values at calibration circuitry;
    generating, at an output of the calibration circuitry operating in a first mode, the calibration values received from the conversion circuitry;
    generating, at the output of the calibration circuitry operating in a second mode, an output value corresponding to the sum of the calibration values received during a time period divided by a number of calibration cycles; and
    providing a compensation signal that is based on the output value to an auxiliary differential input of the differential amplifier.

12. The method of claim 11, wherein the output value is generated in response to a timing input.

13. The method of claim 11, wherein a count of the calibration values corresponds to a particular number of calibration cycles, and wherein the output value indicates an average of the calibration values.

14. The method of claim 11, further comprising:
    generating, at a digital-to-analog converter, the compensation signal based on the output value, wherein the compensation signal comprises an amplifier compensation voltage; and
    providing the amplifier compensation voltage from the digital-to-analog converter to the differential amplifier.

15. The method of claim 11, further comprising receiving, at the calibration circuitry, the calibration values from a successive approximation register.

16. The method of claim 11, further comprising receiving, at the calibration circuitry, the calibration values from an automatic offset voltage compensation circuit.

17. The method of claim 11, further comprising:
    determining a count of calibration cycles; and
    in response to determining that the count of the calibration values satisfies a threshold, sending a timing input to the calibration circuitry.

18. The method of claim 11, wherein the output value is generated in response to a timing input is received during a calibration mode.

19. The method of claim 11, further comprising performing, at the differential amplifier, offset cancellation based on the output value.

20. A computer-readable storage device storing instructions that, when executed by a processor, cause the processor to perform operations comprising:
    generating, at conversion circuitry, calibration values based on output signals of an amplifier;
    accumulating a sum of the calibration values;
    generating, at an output of calibration circuitry operating a first mode, the calibration values received from the conversion circuitry;
    generating, at the output of the calibration circuitry operating in a second mode, an output value corresponding to the sum of the calibration values received during a time period divided by a number of calibration cycles; and
    providing a compensation signal that is based on the output value to an auxiliary differential input of a differential amplifier.

21. The computer-readable storage device of claim 20, wherein the output value indicates an average of the calibration values.

22. The computer-readable storage device of claim 20, wherein the output value is generated in response to a timing input.

23. The computer-readable storage device of claim 20, wherein the operations further comprise sending an offset cancellation signal to the amplifier, the offset cancellation signal based on the output value.

24. The computer-readable storage device of claim 20, wherein the operations further comprise receiving, at calibration circuitry, the calibration values from a successive approximation register.

25. The computer-readable storage device of claim 20, wherein the output value is generated during a calibration mode.

26. The computer-readable storage device of claim 20, further comprising sending a timing input to the calibration circuitry in response to determining that a count of the calibration values satisfies a threshold, wherein the count of the calibration values corresponds to a number of calibration cycles.

27. The computer-readable storage device of claim 20, wherein the operations further comprise receiving the calibration values from an automatic offset voltage compensation circuit.

28. The computer-readable storage device of claim 20, wherein the operations further comprise:

generating the compensation signal based on the output value, wherein the compensation signal comprises an amplifier compensation voltage; and providing the compensation signal to the amplifier.

29. An apparatus comprising:

means for amplifying an input signal, wherein the means for amplifying includes first and second primary differential inputs, first and second auxiliary differential input, and an output;

means for generating calibration values based on the output of the means for amplifying; and means for outputting the calibration values received from the means for generating calibration values in a first operating mode and outputting an output value based on a sum of the calibration values received during a time interval divided by a number of calibration cycles in a second mode of operation, wherein the means for outputting is coupled to one of the auxiliary differential inputs of the means for amplifying.

30. The apparatus of claim 29, wherein the means for amplifying and the means for outputting are integrated into at least one of a mobile phone, a communication device, a computer, a music player, a video player, an entertainment unit, a navigation device, a personal digital assistant (PDA), a decoder, or a set top box.

* * * * *